(12) United States Patent
Hasegawa et al.

(10) Patent No.: US 6,219,400 B1
(45) Date of Patent: Apr. 17, 2001

(54) X-RAY OPTICAL SYSTEM AND X-RAY EXPOSURE APPARATUS

(75) Inventors: Takayuki Hasegawa, Utsunomiya; Yutaka Watanabe, Tochigi-ken, both of (JP)

(73) Assignee: Canon Kabushiki Kaishi, Tokyo (JP)

( * ) Notice: Subject to any disclaimer, the term of this patent is extended or adjusted under 35 U.S.C. 154(b) by 0 days.

(21) Appl. No.: 09/062,014

(22) Filed: Apr. 17, 1998

(30) Foreign Application Priority Data

Apr. 17, 1997 (JP) .................................................... 9-115321
Apr. 13, 1998 (JP) .................................................. 10-117765

(51) Int. Cl.[7] .................................................... G21K 5/00
(52) U.S. Cl. .................................. 378/34; 378/35; 378/84
(58) Field of Search .................................. 378/34, 35, 84, 378/85, 145, 205

(56) References Cited

U.S. PATENT DOCUMENTS

| 5,073,918 | * 12/1991 | Kamon | 378/205 |
| 5,285,488 | 2/1994 | Watanabe | 378/34 |
| 5,394,451 | 2/1995 | Miyake | 378/34 |
| 5,448,612 | 9/1995 | Kasumi | 378/84 |

* cited by examiner

*Primary Examiner*—Robert H. Kim
*Assistant Examiner*—Michael J. Schwartz

(57) ABSTRACT

An X-ray optical system includes an X-ray illumination system having at least two mirrors, a driving system for moving the at least two mirrors, a detecting system having at least one sensor, for detecting at least one of tilt and incidence position of X-rays in the X-ray illumination system, and a control system for controlling movements of the at least two mirrors by the driving system on the basis of detection by the detecting system.

9 Claims, 13 Drawing Sheets

X-RAY OPTICAL SYSTEM AND X-RAY EXPOSURE APPARATUS

FIELD OF THE INVENTION AND RELATED ART

This invention relates to an X-ray optical system wherein X-rays such as radiation from a charged particle accumulation ring are used as exposure light. In another aspect, the invention is concerned with an X-ray exposure apparatus and a semiconductor device manufacturing method which uses such X-ray optical system.

In order to meet recent miniaturization of a pattern of semiconductor devices, various exposure apparatuses which enable transferring and printing a pattern with a minimum linewidth of 0.15 micron (1 gigabit DRAM) have been developed. Among them, X-ray exposure apparatuses wherein X-rays such as radiation from a charged particle accumulation ring are used as exposure light are attractive in respect to both of good transfer and printing precision and good productivity.

As shown in FIG. 1A, X-rays (synchrotron radiation light) such as charged particle accumulation ring radiation are produced from a light emission point as a sheet-like beam having a small thickness in the direction (Y-axis direction) perpendicular to the orbit of a light source 101 such as a charged particle accumulation ring. The sheet-like beam is then expanded by a beam expander such as an expanding mirror 102, in the Y-axis direction. The expanded beam $L_O$ being thus expanded to a required exposure picture angle, is introduced into an exposure chamber through a beryllium window 103, and it irradiates a mask $M_O$ and then a wafer, not shown.

The beam duct from the light source 101 to the beryllium window 103 of the exposure chamber is controlled to provide therein a ultra-high vacuum ambience, to prevent attenuation of X-rays. Also, the inside of the exposure chamber is controlled to provide therein a reduced pressure ambience of helium gas, for example.

The expanding mirror 102 comprises a cylindrical mirror having a reflection surface being curved into a cylindrical shape. It is suspended within a vacuum chamber, not shown. If the relative position of the reflection surface of the expanding mirror 102 and the X-rays, that is, the position of incidence of X-rays, changes in the Y-axis direction, the X-ray intensity distribution of the expanded beam $L_O$ varies largely. It causes large non-uniformness of intensity within the exposure picture angle, and disables uniform exposure. In consideration of this, an actuator 104 is provided to shift the expanding mirror 102 in the Y-axis direction and, additionally, a position sensor 105 for detecting relative positional deviation, in the Y-axis direction, of the X-rays impinging on the expanding mirror 102. The position sensor 105 is provided integrally with the expanding mirror 102, and the output of the position sensor 105 is supplied to a controller 106 to control the actuator 104.

There is another type exposure apparatus wherein the whole surface of a mask is exposed while being scanned with a sheet-like X-ray beam. FIG. 1B shows an X-ray mirror system used in such apparatus and a coordinate system therein. Synchrotron radiation light from a light source 101 is scanningly deflected in Y direction by swinging a flat X-ray mirror 102 by use of driving means, not shown, so as to irradiate the whole surface of a mask $M_O$ with the synchrotron radiation light. In this mirror system, the synchrotron radiation light is directly projected to the mask surface. In such system, control is made to prevent deviation, only in the Y direction, of the center of the intensity distribution of the synchrotron radiation light in the Y direction with respect to the reflection surface of the X-ray mirror 102. This is because a deviation in the Y direction between the synchrotron radiation light and the reflection surface of the X-ray mirror causes a large change in the intensity of X-rays projected on the mask, whereas a deviation in X direction or a rotational deviation wY about the Y axis does not produce a large influence. More specifically, in an X-ray illumination system without light convergence, the reflection surface of an X-ray mirror 102 is flat with respect to the X direction and, as a result of this, a deviation in X direction between the synchrotron radiation light and the mirror reflection surface does not produce an intensity variation in X-rays upon the mask surface. Also, a rotational deviation in wY direction has a small influence. In consideration of the above, a synchrotron radiation light position sensor 105 is used and, on the basis of an output of this sensor, Y-axis mirror driving means 104 is controlled through a controller 106 so as to prevent relative shift of the Y-axis center of the intensity distribution of the synchrotron radiation light with reference to a predetermined position.

There is another type X-ray exposure apparatus wherein an expanding mirror is used to expand X-rays such as charged particle accumulation ring radiation in Y-axis direction and, additionally, a light collecting mirror is provided to collect X-rays in X-axis direction, at a position upstream of the expanding mirror, whereby an expanded beam of higher intensity is produced. The light collecting mirror comprises a concaved surface mirror for converging X-rays of sheet-like beam in the X-axis direction. With this enlargement of intensity of X-rays, the exposure time can be reduced considerably. That is, in such structure, an X-ray illumination system having two mirrors is used to enable simultaneous exposure of the whole surface of a mask with strong X-rays, to thereby improve the productivity of the X-ray exposure apparatus.

With the above-described structure, however, when two or more mirrors (expanding mirror and collecting mirror) are used, only adjustment of the expanding mirror position based on detection of the incidence position of X-ray beam with respect to Y-axis direction such as described above, is insufficient to provide uniform X-ray intensity distribution. If the X-ray incidence position relative to the collecting mirror shifts in the X-axis direction or if the optical axis of the X-rays tilts, the reflection angle of the collecting mirror changes largely, and it causes two-dimensional variation of X-ray intensity distribution within the exposure picture angle.

As described above, X-ray exposure apparatuses having an illumination system with a light collecting mirror, for example, involve a difficulty in achieving sufficient transfer precision.

SUMMARY OF THE INVENTION

It is an object of the present invention to provide an X-ray optical system by which X-ray intensity distribution of X-rays to be projected on an original, such as a mask, through two or more mirrors can be controlled to provide uniform distribution, and by which the transfer precision or productivity of an X-ray exposure apparatus can be improved significantly.

It is another object of the present invention to provide an X-ray exposure apparatus and/or a semiconductor device manufacturing method which is based on such X-ray optical system as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
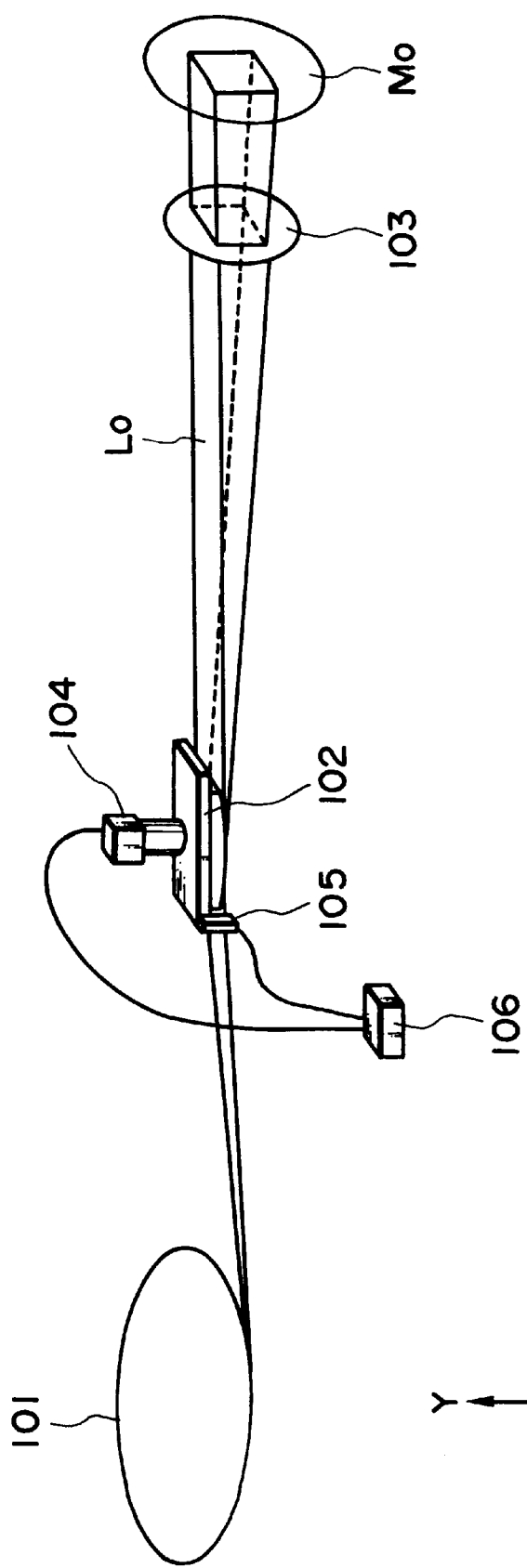
FIG. 1A is a schematic view of an example of X-ray exposure apparatus.
Figure 1B:
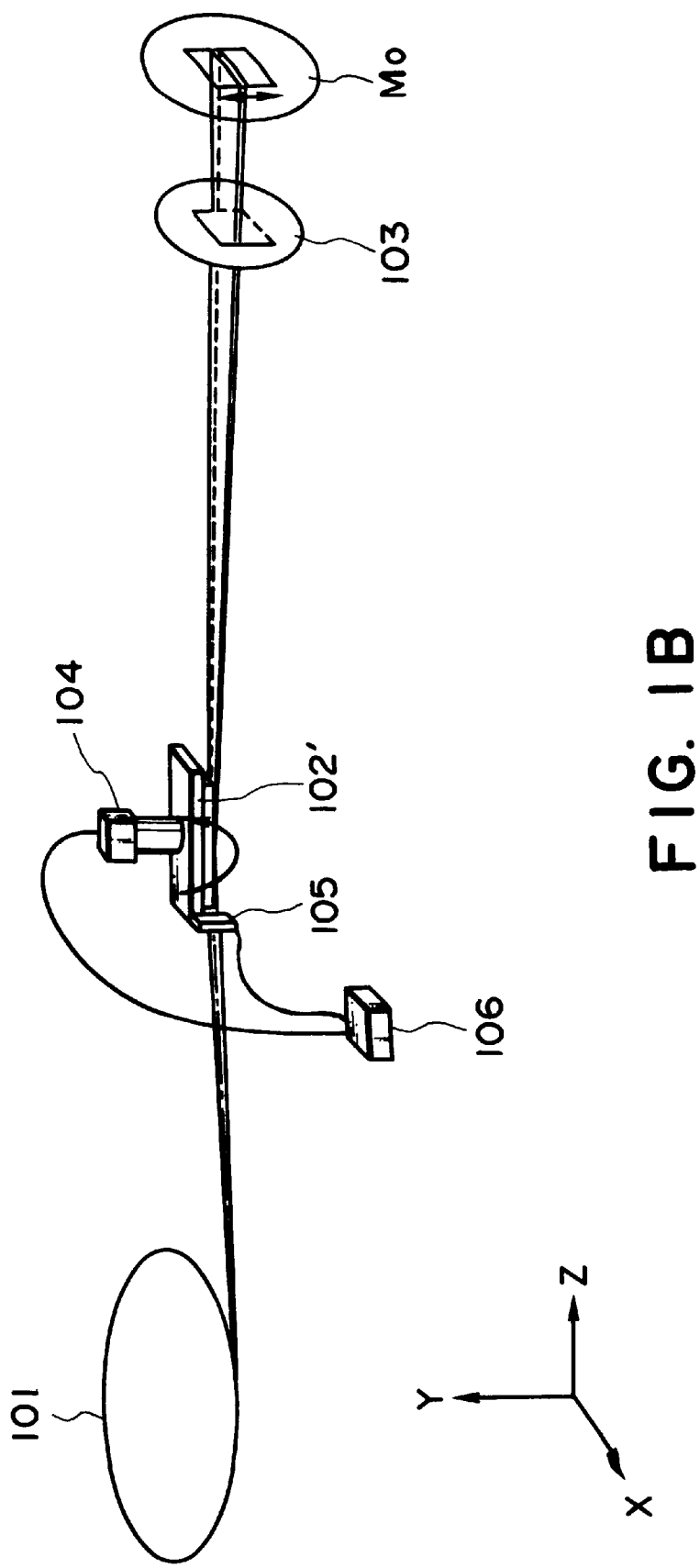
FIG. 1B is a schematic view of another example of X-ray exposure apparatus.
Figure 2:
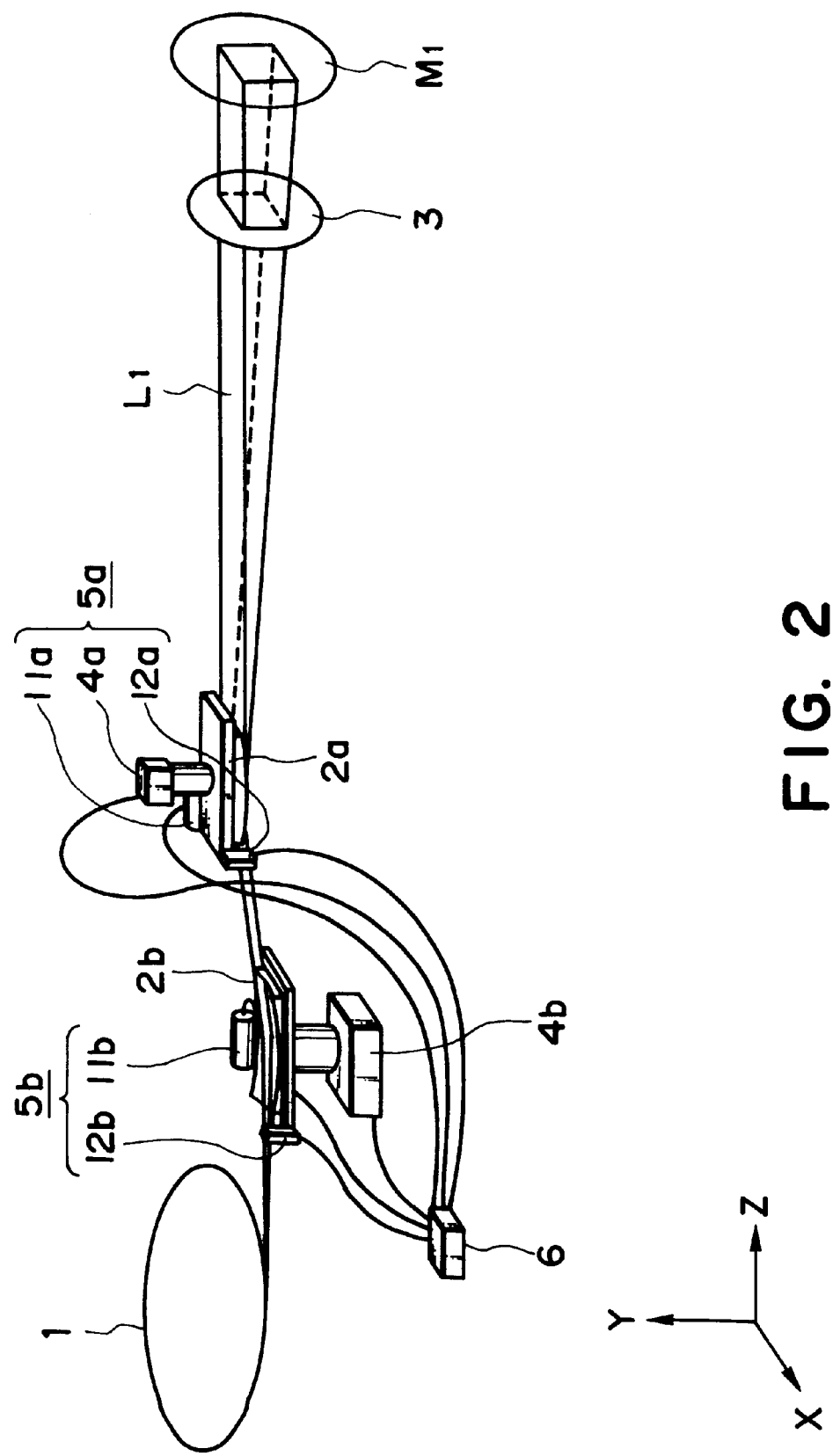
FIG. 2 is a schematic view of an X-ray optical system in an X-ray exposure apparatus, according to a first embodiment of the present invention.

FIG. 2 shows an X-ray optical system in an X-ray exposure apparatus, according to a first embodiment of the present invention. Light source 1 such as a charged particle accumulation ring produces X-rays (synchrotron radiation light) which are emitted from a light emission point as a sheet-like beam with thin thickness in the direction (Y-axis direction) perpendicular to the orbit of the charged particle accumulation ring, for example. It is then expanded in the Y-axis direction by means of an expanding mirror 2a. Disposed upstream of this expanding mirror 2a is a collecting mirror 2b which comprises a concaved surface mirror being curbed with respect to X-axis direction. This mirror serves to collect the X-rays in the X-axis direction to enlarge the intensity, and to project the rays to the expanding mirror 2a.

Expanded beam $L_1$ thus collected and expanded by an X-ray illumination system having the expanding mirror 2a and the collecting mirror 2b, is introduced into an exposure chamber through a beryllium window 3, and it irradiates a mask $M_1$ (original) and then a wafer (substrate) being held by a unshown substrate holding means such as a wafer stage, for example. The beam duct from the light source 1 to the beryllium window 3 of the exposure chamber is controlled to provide therein a ultra-high vacuum ambience to thereby prevent attenuation of X-rays. Also, the the exposure chamber is controlled to provide therein a reduced pressure ambience of helium gas, for example.

The expanding mirror 2a comprises a cylindrical mirror having a reflection surface curved into a cylindrical shape. It is suspended within a vacuum chamber, not shown, If the incidence position or incidence angle of X-rays upon the expanding mirror 2a changes due to fluctuation of X-rays, for example, the X-ray intensity distribution of the expanded beam $L_1$ varies largely. It causes large non-uniformness of intensity within the exposure picture angle, and disables uniform exposure. In consideration of this, an actuator 4a (driving means) for changing the position or attitude of the expanding mirror 2a is provided and, additionally, a beam position detecting device 5a for detecting relative positional deviation of the X-rays relative to the expanding mirror 2a is provided as a unit with the expanding mirror 2a. The output of the beam position detector 5a is applied to a controller 6 to control the actuator 4a.

Like the expanding mirror 2a, the collecting mirror 2b is disposed within a vacuum chamber, and it is supported by an actuator 4b (driving means). If the incidence position or incidence angle of X-rays upon the collecting mirror 2b changes due to fluctuation of X-rays, for example, a required collecting power is not produced. It results in large change in X-ray intensity distribution of the expanded beam $L_1$, and disables uniform exposure. In consideration of this, an actuator 4b (driving means) for changing the position or attitude of the collecting mirror 2b is provided and, additionally, a beam position detecting device 5b for detecting relative positional deviation of the X-rays relative to the collecting mirror 2b is provided as a unit with the collecting mirror 2b. The output of the beam position detector 5b is supplied to the controller 6 to control the actuator 4b.

The beam position detector 5a for the expanding mirror 2a and the beam position detector 5b for the collecting mirror 2b have the same structure. They comprise optical axis sensors 11a and 11b (first measuring means), respectively, for detecting X-axis incidence position of X-rays and incidence angles of X-rays with respect to wX and wY directions, and position sensors 12a and 12b (second measuring means), respectively, for detecting Y-axis incidence position of X-rays and incidence angle of X-rays with respect to wZ direction.

Figure 3A:
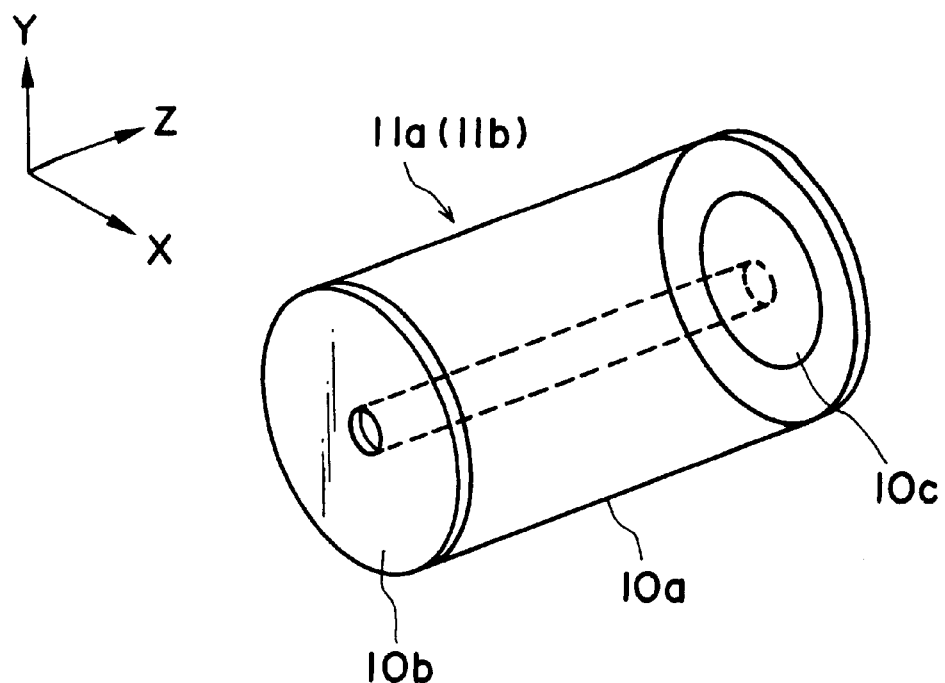
FIG. 3A is a perspective view of an optical axis sensor used in the embodiment of FIG. 2.

As shown in FIG. 3A, each of the optical axis sensors 11a and 11b comprises a cylindrical frame member 10a, a pinhole plate 10b fixed to one end thereof, and an X-ray area sensor 10c held at the other end of the frame member 10a. X-rays passing through the pinhole 10b are sensed as a spot upon the X-ray area sensor 10c. If the optical axis of the X-rays tilts, the position of the spot on the X-ray area sensor shifts. The amount of such shift of spot position is measured and, on the basis of the amount of shift and of the distance between the pinhole 10b and the X-ray area sensor 10c, the tilt of the optical axis of X-rays with respect to the wX and wY directions is calculated. Then, on the basis of these data, the incidence position of X-rays with respect to the X-axis direction and incidence angles of X-rays with respect to the wX and wY directions, relative to the expanding mirror 2a and collecting mirror 2b, are determined.

Figure 3B:
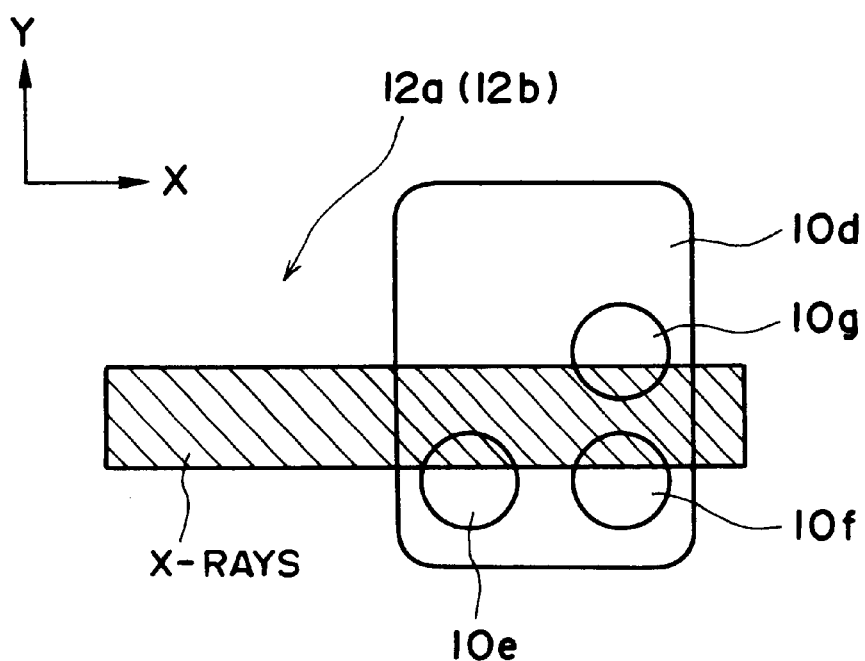
FIG. 3B is a schematic view of a position sensor used in the embodiment of FIG. 2.

As shown in FIG. 3B, each of the position sensor 12a and 12b comprises a supporting member 10d which is integral with the expanding mirror 2a or collecting mirror 2b, and first to third X-ray intensity sensors 10e–10g being supported by the supporting member. The first and second X-ray intensity sensors 10e and 10f are disposed in series along the X-axis direction, and the second and third X-ray intensity sensors 10f and 10g are disposed in series along the Y-axis direction. From the ratio between the outputs of the first and second X-ray intensity sensors 10e and 10f, the incidence angle of the sheet-like X-ray beam about the optical axis (i.e., in the wZ direction) can be detected. Also, by comparing the sum and the difference of and between outputs of the second and third X-ray intensity sensors 10f and 10g, the incidence position of X-rays with respect to the Y-axis direction can be detected.

As described above, the expanding mirror 2a and collecting mirror 2b are equipped with beam position detecting devices 5a and 5b, respectively, for detecting incidence positions of X-rays with respect to X-axis and Y-axis directions as well as incidence angles with respect to wX, wY and wZ directions. On the basis of the outputs of these sensors, drive amounts for the actuators 4a and 4b for the expanding mirror 2a and the collecting mirror 2b are controlled. This avoids relative positional deviation of the expanding mirror 2a or collecting mirror 2b with respect to the X-rays impinging thereupon.

The X-ray intensity distribution of the expanded beam $L_1$, being expanded by the expanding mirror 2a in the thickness direction (Y-axis direction) and additionally being collected by the collecting mirror 2b into high intensity, can be maintained constant stably as above and, as a result, uniform and simultaneous exposure can be done in a short time. This provides improved transfer precision of X-ray exposure apparatus as well as significantly enlarged throughput.

Figure 4:
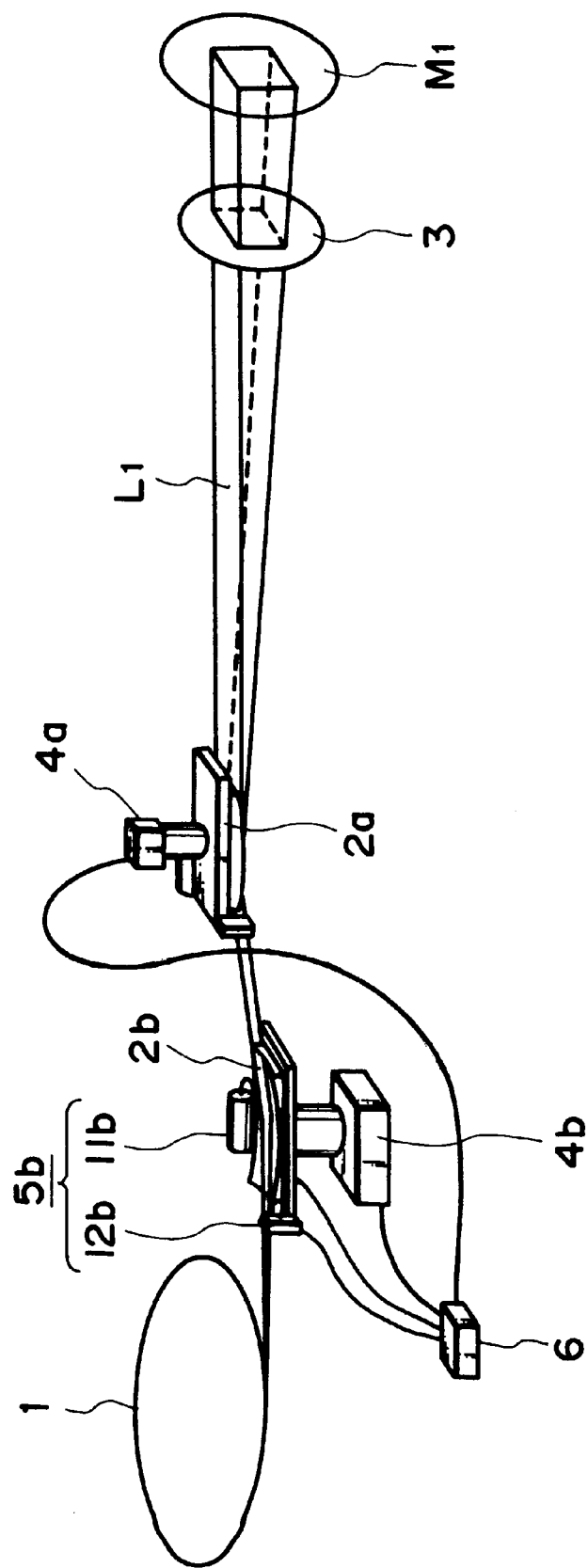
FIG. 4 is a schematic view of a modified form of the first embodiment of the present invention.

FIG. 4 shows a modified form of the first embodiment. In this structure, only the collecting mirror 2b is equipped with a beam position detecting device 5b, and the beam position detecting device 5b for the expanding mirror 2a is omitted. As regards the incidence position of the X-rays and tilt, for example, of the X-rays with respect to the expanding mirror 2a, they can be calculated by the controller 6 on the basis of the drive amount of the actuator 4b and the output of the beam position detecting device 5b for the collecting mirror 2b. Particularly, when the actuator 4a for the expanding mirror 2a is arranged to control only the incidence position of X-rays with respect to the Y-axis direction, use of the detected data from the beam position detecting device 5b of the collecting mirror 2b such as described above is effective and preferable in respect to simplification of the structure of the X-ray optical system.

Figure 5:
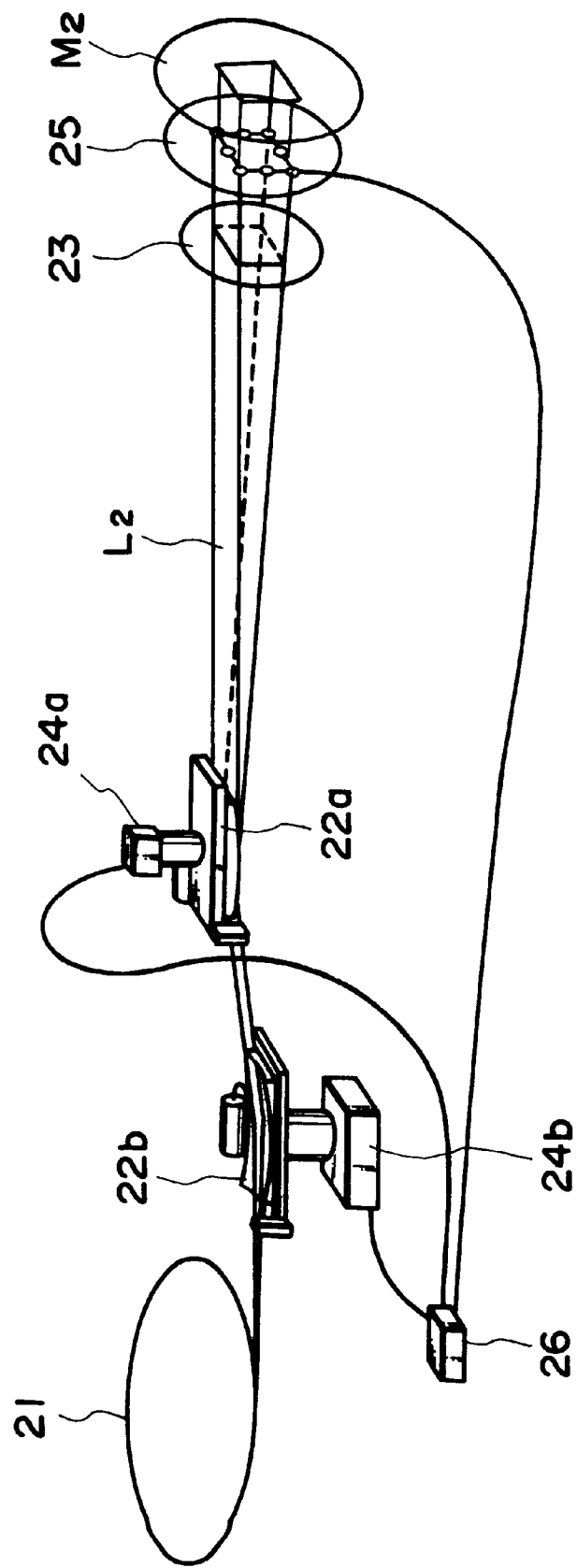
FIG. 5 is a schematic view of an X-ray optical system according to a second embodiment of the present invention.

FIG. 5 shows an X-ray optical system according to a second embodiment of the present invention. Like the first embodiment, light source 21 such as a charged particle accumulation ring produces X-rays (synchrotron radiation light) which are emitted from a light emission point as a sheet-like beam with thin thickness in the direction (Y-axis direction) perpendicular to the orbit of the charged particle accumulation ring, for example. It is then expanded in the Y-axis direction by means of an expanding mirror 22a. Disposed upstream of this expanding mirror 22a is a collecting mirror 22b which comprises a concaved surface mirror being curbed with respect to X-axis direction. This mirror serves to collect the X-rays in the X-axis direction to enlarge the intensity, and to project the rays to the expanding mirror 22a.

Expanded beam $L_2$ thus collected by the collecting mirror 22b and expanded by the expanding mirror 22a, is introduced into an exposure chamber through a beryllium window 23, and it irradiates a mask $M_2$ (original) and then a wafer (substrate) being held by a unshown substrate holding means such as a wafer stage, for example. The beam duct from the light source 21 to the beryllium window 23 of the exposure chamber is controlled to provide therein a ultra-high vacuum ambience to thereby prevent attenuation of X-rays. Also, the the exposure chamber is controlled to provide therein a reduced pressure ambience of helium gas, for example.

The expanding mirror 22a comprises a cylindrical mirror having a reflection surface curved into a cylindrical shape. It is suspended within a vacuum chamber, not shown, If the incidence position or incidence angle of X-rays upon the expanding mirror 22a changes due to fluctuation of X-rays, for example, the X-ray intensity distribution of the expanded beam $L_2$ varies largely. It causes large non-uniformness of intensity within the exposure picture angle, and disables uniform exposure. In consideration of this, an actuator 24a (driving means) for changing the position or attitude of the expanding mirror 22a is provided and, additionally, an X-ray intensity distribution sensor 25 which comprises measuring means having at least four X-ray intensity sensors is provided. Also, there is a controller 26 (control means) which serves to detect relative positional deviation of the X-rays relative to the expanding mirror 22a on the basis of the output of the X-ray intensity distribution sensor 25 and to control the actuator 24a.

Like the expanding mirror 22a, the collecting mirror 22b is disposed within a vacuum chamber, and it is supported by an actuator 24b (driving means). If the incidence position or incidence angle of X-rays upon the collecting mirror 22b changes due to fluctuation of X-rays, for example, a required collecting power is not produced. It results in large change in X-ray intensity distribution of the expanded beam $L_2$, and disables uniform exposure. In consideration of this, an actuator 24b (driving means) for changing the position or attitude of the collecting mirror 22b is provided. Additionally, a relative positional deviation of the X-rays with respect to the collecting mirror 22b is detected on the basis of the output of the X-ray intensity distribution sensor 25, and the result is applied to the controller 26 to control the actuator 24b.

Figure 6:
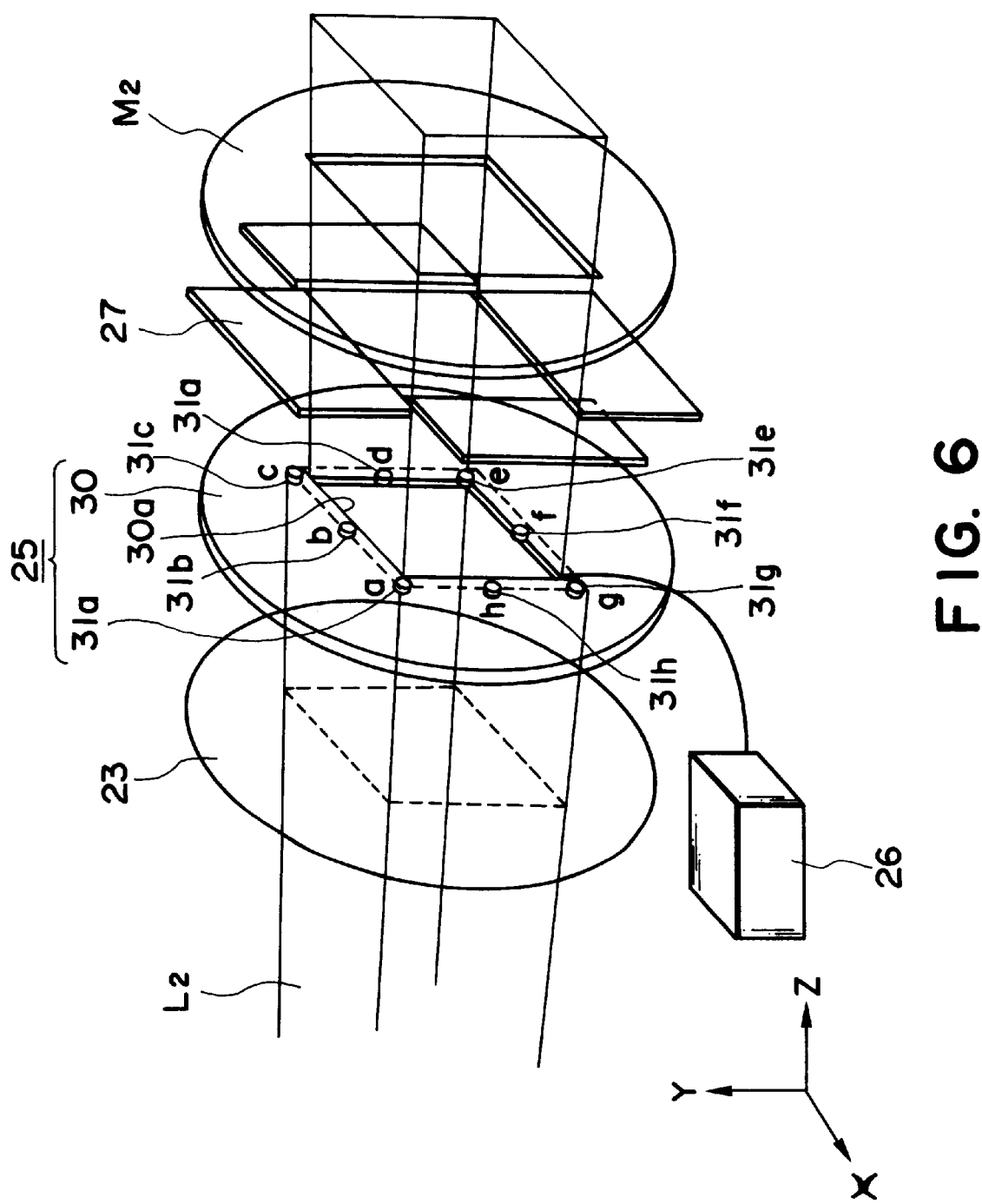
FIG. 6 is an enlarged and schematic view of an X-ray intensity distribution sensor used in the structure of FIG. 5.

As shown in an enlarged view of FIG. 6, the X-ray intensity distribution sensor 25 comprises an aperture member 30 which is disposed upstream of a variable aperture member 27 for defining the exposure angle to the expanded beam $L_2$ to be projected to the mask $M_2$, and eight X-ray intensity sensors 31a–31h in this embodiment which are disposed at the peripheral edge of the aperture 30a of the aperture member 30. The aperture 30a of the aperture member 30 has a rectangular shape. The X-ray intensity sensors 31a, 31c, 31e and 31g are disposed at four corners of the aperture 30a, respectively, while the remaining X-ray intensity sensors are disposed at middles of sides of the apertures 30a, respectively. It should be noted that, as regards the number of X-ray intensity sensors, a number of at least four may be sufficient. Namely, the number is not limited to eight and, as an example, the X-ray intensity sensors 31b, 31d, 31f and 31h disposed at the sides of the aperture 30a may be omitted.

Figure 7A:
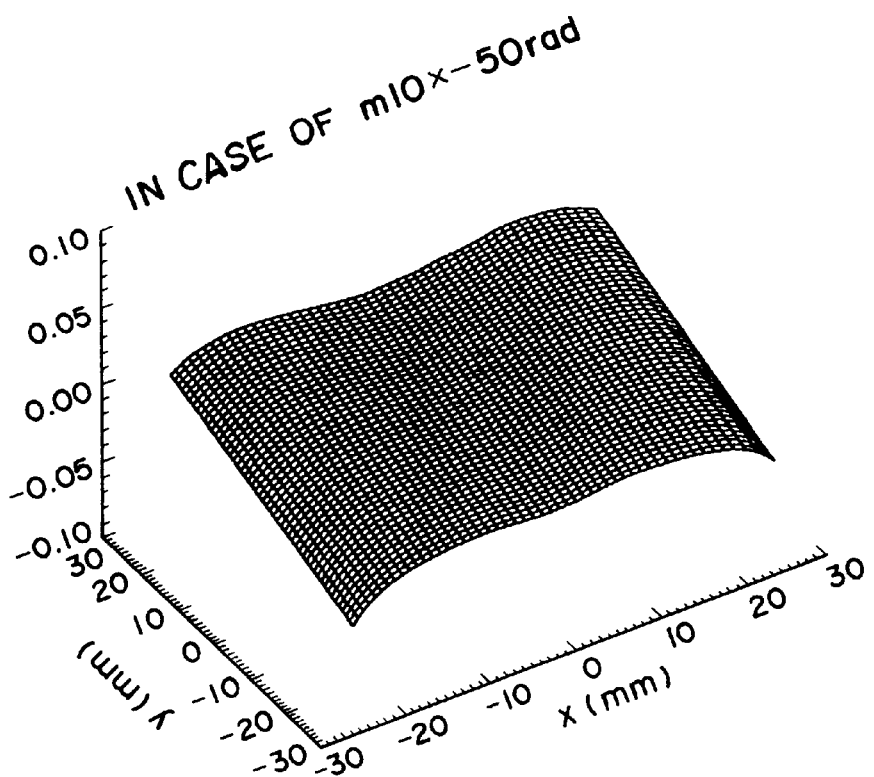
FIGS. 7A and 7B show examples of actually measured X-ray intensity distribution of an expanded beam.

As regards the X-ray intensity distribution of the expanded beam $L_2$ having been collected by the collecting mirror 22b with respect to the X-axis direction and having been expanded by the expanding mirror 22a in the Y-axis direction, a notable change can be observed particularly at the four sides of the mask $M_2$ with a change in incidence position or incidence angle thereof with respect to the expanding mirror 22a or the collecting mirror 22b. FIG. 7A shows the result of measurement of the X-ray intensity distribution, measured upon the mask $M_2$ surface, as the relative position (tilt) of the collecting mirror 22b and the X-rays shifts by +ΔwX. It is seen from this drawing that the X-ray intensity decreases as a whole in inverse direction (negative direction) along the Y axis. Also, local X-ray intensity decreases are observed at the opposite ends in the X-axis direction.

Figure 7B:
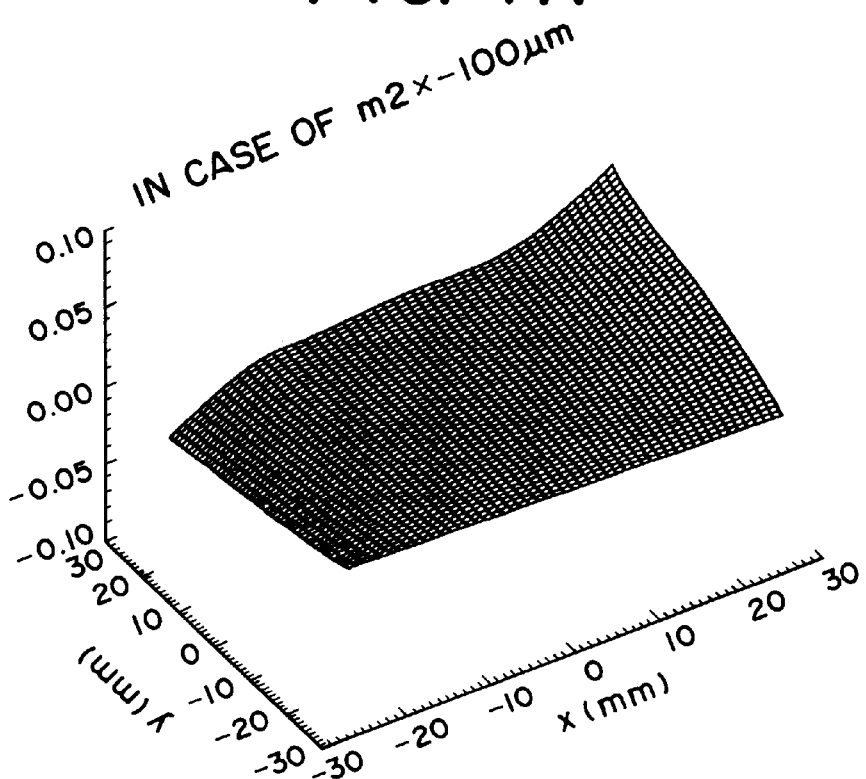

FIG. 7B shows measurement data as the relative position (tilt) of the collecting mirror 22b and the X-rays shift by −ΔwX, to the contrary. In this case, the X-ray intensity decreases as a whole in the direction (positive direction) along the Y axis. Also, local X-ray intensity increases are observed at the opposite ends in the X-axis direction.

As described above, from the profile of increase/decrease of outputs of the eight X-ray intensity sensors 31a–31h disposed along the peripheral edge of the exposure view angle, relative positional deviation of the X-rays with respect to the collecting mirror 22b or the expanding mirror 22a can be discriminated, specifically as to which of X, Y, wX, wY and Z directions the deviation resides in. More specifically, the outputs of the X-ray intensity sensors 31a–31h are applied to a computing means (not shown) and these outputs are compared with each other in accordance with the following equations:

$$\{(Ia+Ic)-(Ie+Ig)\}/\{(Ia+Ic)+(Ie+Ig)\} \quad (1)$$

$$\{(Ia+Ig)-(Ic+Ie)\}/\{(Ia+Ig)+(Ic+Ie)\} \quad (2)$$

$$\{(Ia+Ie)-(Ic+Ig)\}/\{(Ia+Ie)+(Ic+Ig)\} \quad (3)$$

Side ac: $(Ia-Ib)/(Ia+Ib), (Ib-Ic)/(Ib+Ic)$ (4)

Side ce: $(Ic-Id)/(Ic+Id), (Id-Ie)/(Id+Ie)$ (5)

Side eg: $(Ie-If)/(Ie+If), (If-Ig)/(If+Ig)$ (6)

Side ga: $(Ig-Ih)/(Ig+Ih), (Ih-Ia)/(Ih+Ia)$ (7)

If for example the collecting mirror 22b shifts by +ΔwX, then:

$$\{(Ia+Ic)-(Ie+Ig)\}/\{(Ia+Ic)+(Ie+Ig)\}>0 \quad (1)$$

$$\{(Ia+Ig)-(Ic+Ie)\}/\{(Ia+Ig)+(Ic+Ie)\}=0 \quad (2)$$

$$\{(Ia+Ie)-(Ic+Ig)\}/\{(Ia+Ie)+(Ic+Ig)\}=0 \quad (3)$$

$(Ia-Ib)/(Ia+Ib)<0, (Ib-Ic)/(Ib+Ic)>0$ (4)

$(Ic-Id)/(Ic+Id)>0, (Id-Ie)/(Id+Ie)>0$ (5)

$(Ie-If)/(Ie+If)<0, (If-Ig)/(If+Ig)>0$ (6)

$(Ig-Ih)/(Ig+Ih)<0, (Ih-Ia)/(Ih+Ia)<0$ (7)

Using these equations in combination, deviation of X-ray intensity distribution can be discriminated as being a relative positional deviation of the collecting mirror 22b in +ΔwX direction, and appropriate drive amount of the actuator 24b with which all of these equations result in zero (0) is calculated. In this manner, the position or attitude of the collecting mirror 22b is adjusted.

As described, the X-ray intensity distribution of the expanded beam $L_2$, being expanded by the expanding mirror 22a in the thickness direction (Y-axis direction) and additionally being collected by the collecting mirror 22b into high intensity, can be maintained constant stably as above and, as a result, uniform and simultaneous exposure can be done in a short time. This provides improved transfer precision of X-ray exposure apparatus as well as significantly enlarged throughput.

Additionally, since the X-ray intensity distribution of the expanded beam $L_2$ just prior to impingement on the mask $M_2$ is measured directly, there is a specifically advantageous effect that high precision control which is very effective to provide uniform X-ray intensity distribution upon the wafer surface to be exposed, is assured.

Further, as compared with an arrangement wherein the collecting mirror or expanding mirror is equipped with an optical axis sensor or a position sensor, the structure around the mirror can be simplified.

Figure 8:
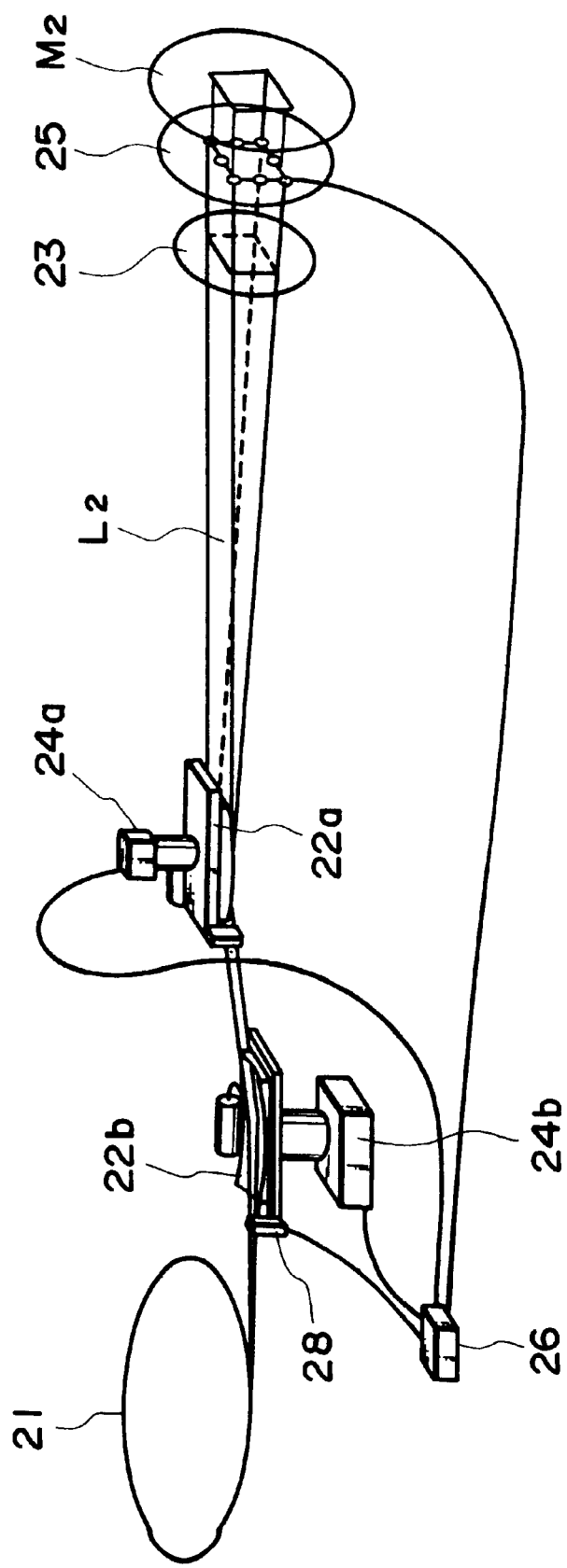
FIG. 8 is a schematic view of a modified form of the second embodiment of the present invention.

FIG. 8 shows a modified form of the second embodiment. In this structure, a position sensor 28 which comprises three X-ray intensity sensors is added to the collecting mirror 22b, by which relative positional deviations of X-rays in the Y-axis direction and in the wZ direction, with respect to the collecting mirror 22b, can be detected. Since the relative positional deviations to be calculated by the X-ray intensity distribution sensor 25 require only three in the X-axis direction, wX direction and wY direction, algorithm of computing means can be simplified. Thus, the processing time can be advantageously reduced.

Figure 9:
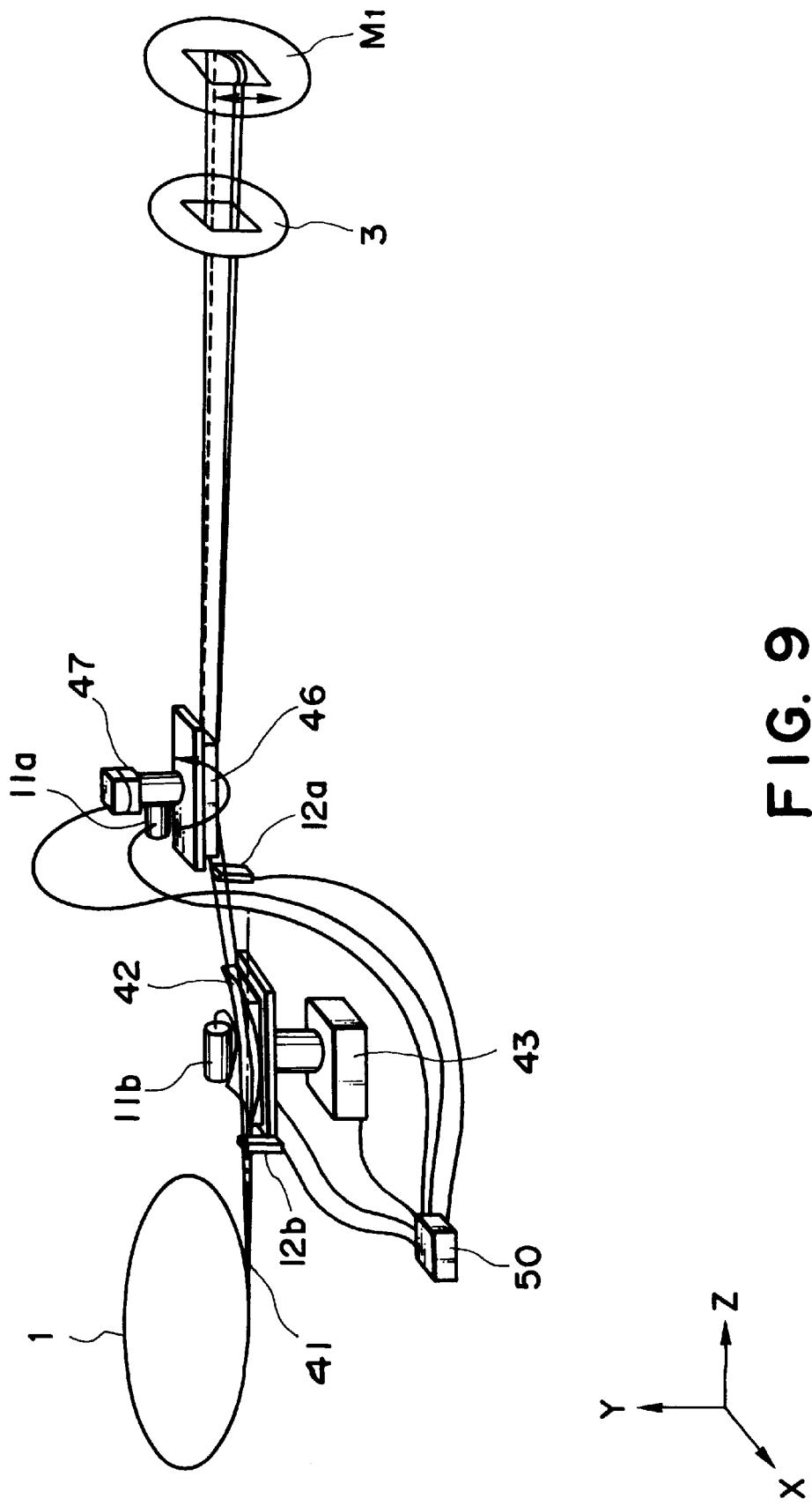
FIG. 9 is a schematic view of an X-ray optical system according to a third embodiment of the present invention.

FIG. 9 shows a third embodiment of the present invention, and illustrates an X-ray illumination system having two X-ray mirrors, like the preceding embodiments. In this illumination system, the synchrotron radiation light is collected with respect to the X direction. It is expanded in the Y direction by swinging movement of an X-ray mirror, to illuminate the surface of a mask. Denoted in FIG. 9 at 41 is synchrotron radiation light, and denoted at 42 is a first X-ray mirror. Denoted at 43 is driving means for moving the first mirror to adjust the position or attitude thereof. Denoted at 12b is a position sensor, like that described hereinbefore, which is fixedly mounted on the first mirror to detect the intensity center of the synchrotron radiation light. Denoted at 11b is an optical axis sensor, like that described hereinbefore, which is fixedly mounted on the first mirror to detect the optical axis of synchrotron radiation light.

Denoted at 46 is a second X-ray mirror, and denoted at 47 is driving means for moving the second mirror to adjust the position or attitude of it. Denoted at 12a a position sensor, like that described hereinbefore, which is fixedly mounted on the first mirror to detect the intensity center of the synchrotron radiation light. Denoted at 11a is an optical axis sensor, like that described hereinbefore, which is fixedly mounted on the first mirror to detect the optical axis of synchrotron radiation light.

Denoted at 50 is control means which serves to control the driving means 43 for the first mirror 42 on the basis of the outputs of the position sensor 12b and the optical axis sensor 11b, and also to control the driving means 47 for the second mirror 46 on the basis of the outputs of the position sensor 12a and the optical axis sensor 11a. Denoted at 3 is a beryllium window (vacuum partition) like that described hereinbefore, which functions as an X-ray extraction window. Denoted at $M_1$ is an X-ray mask which is demountably mounted on a mask stage, not shown, of an X-ray exposure apparatus, not shown. Denoted at 1 is a light source which in this embodiment comprises a synchrotron radiation ring for accumulating electrons therein and for emitting synchrotron radiation light. While not specifically illustrated in this drawing, the components from the synchrotron ring 1 to the beryllium window are placed inside a vacuum chamber wherein a ultra-high vacuum is kept therein.

In the structure described above, the synchrotron radiation light 41 emitted from the synchrotron radiation ring 1 impinges on the first mirror 42. Also, at the same time, the synchrotron radiation light impinges on the position sensor 12b and the optical axis sensor 11b. In response, the intensity center position and the optical axis of the synchrotron radiation light are detected.

Thus, a change in synchrotron radiation light with respect to X, Y, wX, wY and wZ directions can be detected. Measured values are applied to the control means 50, whereby drive amounts for the first mirror driving means 43 with respect to these directions are calculated and the position or attitude of the first mirror 42 is controlled.

The second mirror 46 also should be controlled into a predetermined position or attitude with respect to the synchrotron radiation light 41. To this end, like the case of the first mirror 42, the outputs of the X-ray position sensor 12a and the X-ray optical axis sensor 11a are applied to the control means 50, whereby drive amounts for the second mirror driving means 47 with respect to various directions are calculated and the position or attitude of the second mirror 46 is controlled. Here, since the center of swinging movement of the second mirror 46 during the scan exposure operation should be controlled to a predetermined position or attitude with respect to the synchrotron radiation light, an unshown swinging motion mechanism is mounted on the driving means 47. Namely, the drive amount of the driving means 47 is a value with which the center of swinging motion of the swinging mechanism is placed at a predetermined position or attitude with respect to the synchrotron radiation light 41.

Figure 10:
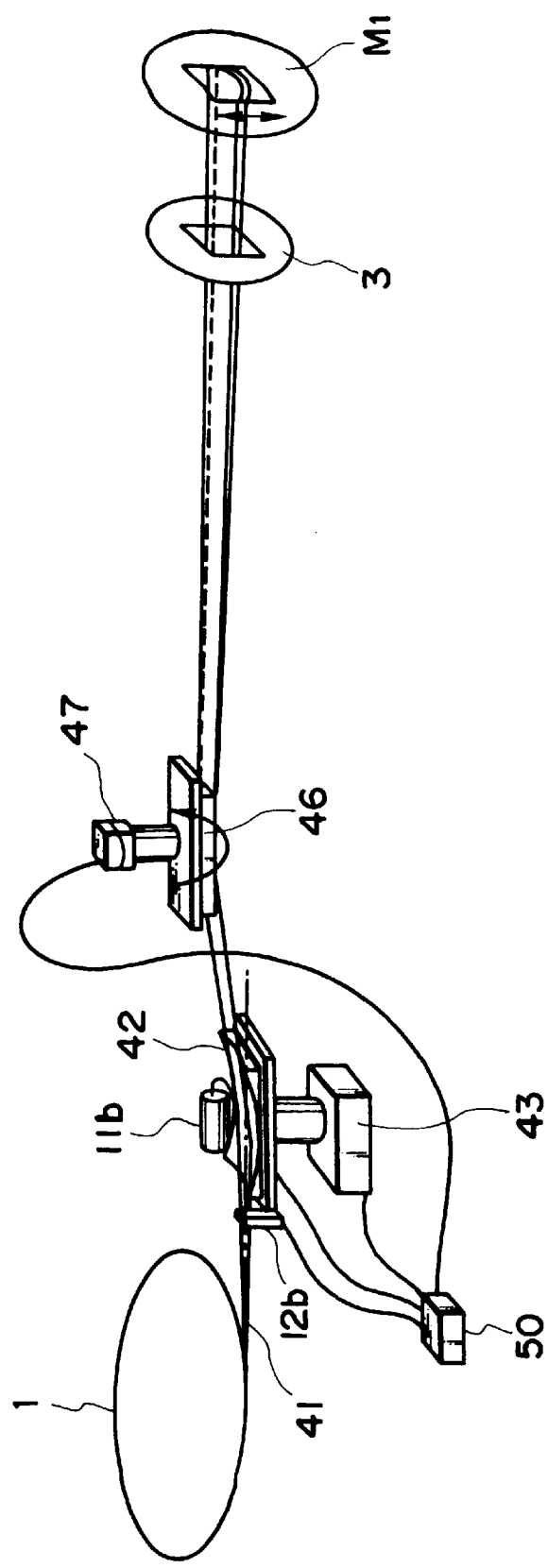
FIG. 10 is a schematic view of a modified form of the third embodiment of the present invention.

FIG. 10 shows a modified form of the third embodiment of the present invention. In this structure, as regards the second mirror 46, a drive amount for controlling the position or attitude of the second mirror 46 is calculated by the control means 50 on the basis of the output of the synchrotron radiation light optical axis sensor 11b and of the drive amount for controlling the position of the first mirror 42. This structure provides the following advantage: since there is no necessity of provision of an intensity sensor and an optical axis sensor on the second mirror, the structure of the second mirror can be made quite simple.

Next, an embodiment of device manufacturing method which uses an X-ray exposure apparatus as described above, will be explained.

Figure 11:
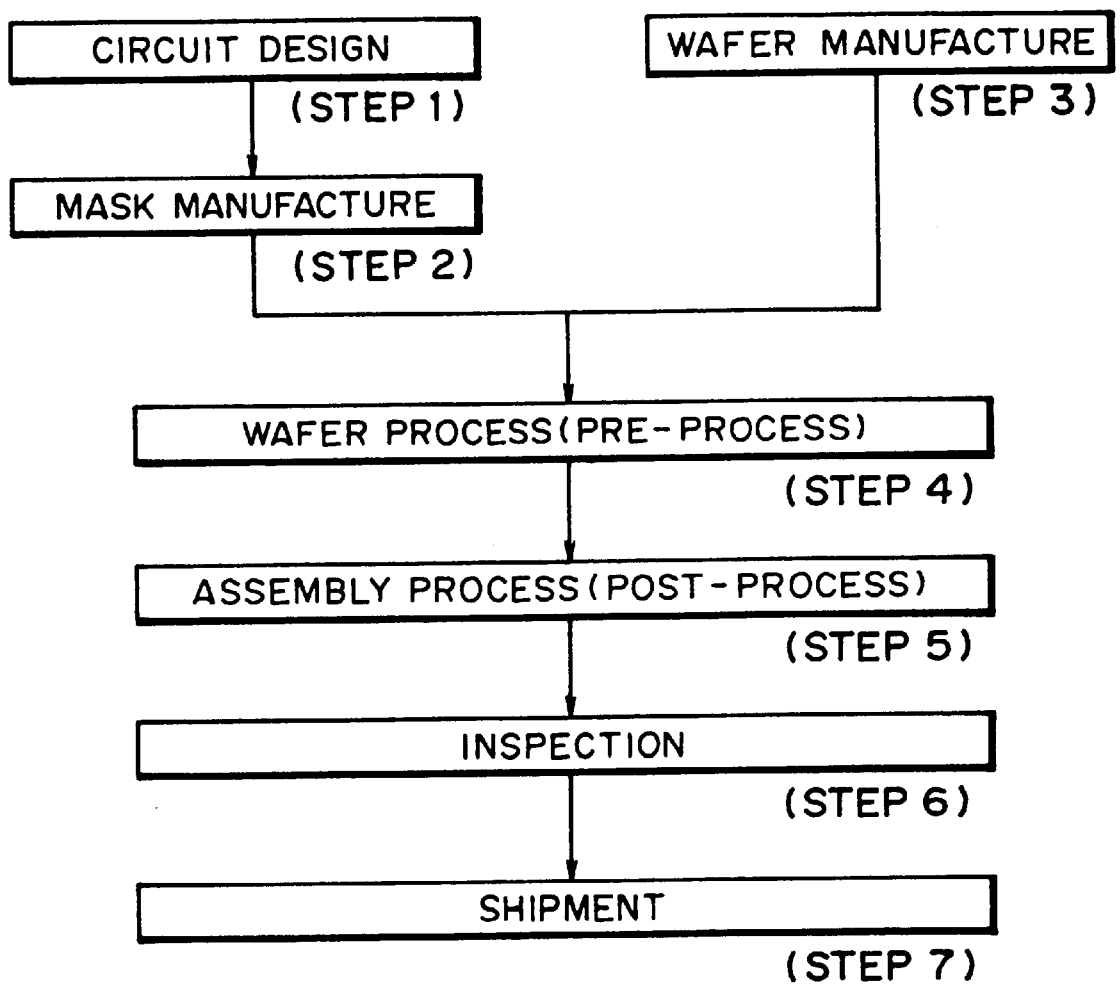
FIG. 11 is a flow chart of semiconductor device manufacturing processes.

FIG. 11 is a flow chart of procedure for manufacture of microdevices such as semiconductor chips (e.g. ICs or LSIs), liquid crystal panels, or CCDS, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a preprocess wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) process and packaging (chip sealing) process. Step 6 is an inspection step wherein operation check, durability check and so on for the semiconductor devices provided by step 5, are carried out. With these processes, semiconductor devices are completed and they are shipped (step 7).

Figure 12:
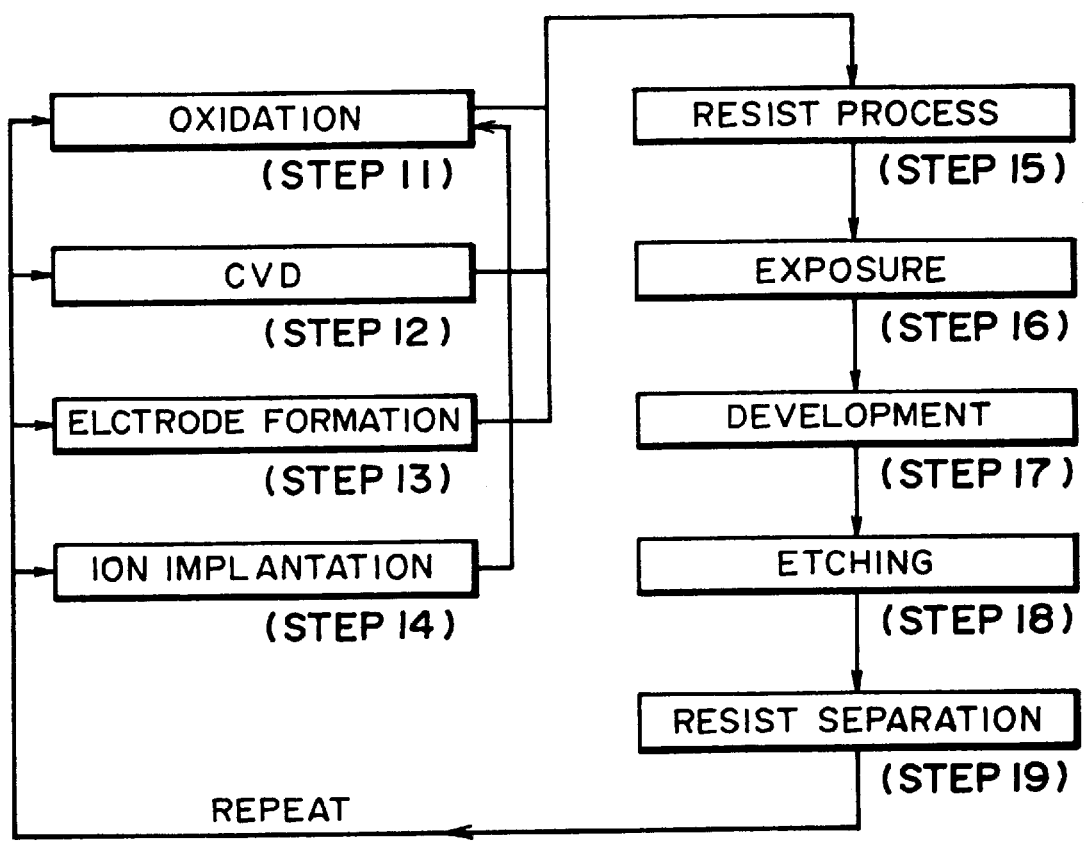
FIG. 12 is a flow chart of a wafer process.

FIG. 12 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An X-ray optical system, comprising:

an X-ray illumination system having at least two mirrors, wherein at least one mirror is a collecting mirror having a concave surface;

a driving system for moving said at least two mirrors;

a detecting system having at least one sensor, for detecting at least one of tilt and incidence position of X-rays in said X-ray illumination system, wherein said at least one sensor is provided integrally with at least one of said at least two mirrors; and a control system for controlling movements of said at least two mirrors by said driving system on the basis of detection by said detecting system.

2. An X-ray optical system according to claim 1, wherein said driving system is arranged to change the position and attitude of said at least two mirrors.

3. An X-ray optical system according to claim 1, wherein said detecting system comprises first sensors provided with respect to said at least two mirrors, respectively, for detecting tilt of an optical axis of an X-ray beam, and second sensors provided with respect to said at least two mirrors, respectively, for detecting one of incidence position of the X-ray beam and an angle thereof about the optical axis.

4. An X-ray optical system according to claim 1, wherein said detecting system comprises a first sensor provided in relation to one of said at least two mirrors, for detecting tilt of an optical axis of an X-ray beam, and a second sensor provided in relation to the one mirror, for detecting one of incidence position of the X-ray beam and an angle thereof about the optical axis, and wherein said control system controls movement of the one mirror by said driving means on the basis of detection by said detecting system and also controls movement of the other or another mirror of said at least two mirrors on the basis of the detection by said detecting means and a drive amount for the one mirror.

5. An X-ray optical system according to claim 1, wherein said X-ray illumination system is arranged to collect the X-rays in one direction with respect to a sectional plane of the X-ray beam, and to expand the X-rays in another direction with respect to the sectional plane.

6. An X-ray optical system according to claim 1, wherein said X-ray illumination system is arranged to perform scanning illumination with X-rays.

7. An X-ray exposure apparatus for exposing an object to X-rays, comprising:

an X-ray illumination system having at least two mirrors, wherein the object can be exposed with X-rays projected through action of said at least two mirrors, wherein at least one mirror is a collecting mirror with a concave surface;

a driving system for moving said at least two mirrors;

a detecting system having at least one sensor, for detecting at least one of tilt and incidence position of X-rays in said X-ray illumination system, wherein said at least one sensor is provided integrally with at least one of said at least two mirrors; and a control system for controlling movements of said at least two mirrors by said driving system on the basis of detection by said detecting system.

8. An apparatus according to claim 7, wherein said X-ray illumination system is arranged to collect the X-rays in one direction with respect to a sectional plane of the X-ray beam, and to expand the X-rays in another direction with respect to the sectional plane.

9. An apparatus according to claim 7, wherein said X-ray illumination system is arranged to perform exposure of the object with X-rays.

* * * * *

UNITED STATES PATENT AND TRADEMARK OFFICE
CERTIFICATE OF CORRECTION

PATENT NO. : 6,219,400 B1
DATED : April 17, 2001
INVENTOR(S) : Takayuki Hasegawa et al.

It is certified that error appears in the above-identified patent and that said Letters Patent is hereby corrected as shown below:

Column 1,
Lines 6, 9, 16, 46, and 63, "X-ray" should read -- x-ray --;
Lines 7, 17, 21 and 52, "X-rays" should read -- x-rays --;
Line 11, "such X-ray" should read -- such an x-ray --;
Line 12, "meet" should read -- accomplish the --; and "a pattern of" should be deleted;
Line 13, "devices," should read -- device patterns, --;
Line 14, "printing" should read -- printing of --;
Line 18, "in" should read -- with --;
Line 19, "of" should be deleted;
Line 27, "expander" should read -- expander, --;
Line 28, "$L_o$" should read -- $L_o$, --;
Line 35, "a" should read -- an --; and "ambience," should read -- atmosphere, --;
Line 36, "X-rays." should read -- x-rays. --;
Line 39, "ambience" should read -- atmosphere --;
Line 44, "X-rays," should read -- x-rays, --;
Line 45, "incidence of X-rays," should read -- the incidence of x-rays, --;
Line 47, "largely. It causes large non-uniformness" should read -- to a large degree. It prevents uniformity --;
Line 48, "angle," should read -- angle --;
Line 57, "type" should read -- type of --;
Line 59, "X-ray" (both occurrences) should read -- x-ray --;
Line 60, "such" should read -- such an --;
Line 62, "Y" should read -- the Y --; and
Line 66, "to" should read -- onto --.

Column 2,
Lines 3, 6, 10, 11, 43, 44, 48, 50, 57, 58, 62 and 65, "X-ray" should read -- x-ray --;
Lines 7, 15, 24, 46 and 59, "X-rays" should read -- x-rays --;
Line 8, "X" should read -- the X --;
Line 9, "influence." should read -- effect. --;
Line 12, "direction" should read -- direction, --; and "X" should read -- the X --;
Line 18, "used" should read -- used, --;
Line 23, "type X-ray" should read -- type of x-ray --;
Lines 25 and 42, "Y-axis" should read -- the Y-axis --;
Line 27, "X-rays in X-axis" should read -- x-rays in the X-axis --;
Line 30, "concaved" should read -- concave --; and "X-rays" should read -- x-rays --;
Line 32, "X-rays," should read -- x-rays, --;
Line 33, "such" should read -- such a --; and "X-ray" should read -- x-ray --;
Line 36, "X-rays" should read -- x-rays, --; and "X-ray" should read -- x-ray --;

UNITED STATES PATENT AND TRADEMARK OFFICE
CERTIFICATE OF CORRECTION

PATENT NO. : 6,219,400 B1
DATED : April 17, 2001
INVENTOR(S) : Takayuki Hasegawa et al.

It is certified that error appears in the above-identified patent and that said Letters Patent is hereby corrected as shown below:

Column 2, (cont'd),
Line 41, "X-ray" should read -- an x-ray --;
Line 52, "involve a" should read -- have --; and
Line 66, "such X-ray" should read -- such an x-ray --.

Column 3,
Lines 8 and 10, "X-ray" should read -- an x-ray --;
Lines 12, 13, 22, 24, 27, 30, and 57, "X-ray" should read -- x-ray --;
Line 41, "X-ray" (both occurrences) should read -- x-ray --;
Lines 44 and 53, "X-rays" should read -- x-rays --;
Line 46, "thin" should read -- a small --;
Line 51, "concaved" should read -- concave --;
Line 52, "X-axis" should read -- the X-axis --;
Line 54, "intensity," should read -- intensity --;
Line 56, "beam $L_1$" should read -- beam $L_1$, --;
Line 61, "a unshown" should read -- an unillustrated --;
Line 64, "a" should read -- an --; and "ambience" should read -- atmosphere --;
Line 65, "X-rays." should read -- x-rays. --; and
Line 67, "ambience" should read -- atmosphere --.

Column 4,
Lines 4, 12, 19, 27, 46, 52, 54 and 55, "X-rays" should read -- x-rays --;
Lines 5 and 20, "X-rays," should read -- x-rays, --;
Line 6, "X-ray" should read -- x-ray --;
Line 7, "largely. It causes large non-uniformness" should read -- to a large degree. It prevents uniformity --;
Line 8, "angle," should read -- angle --;
Line 21, "large" should read -- a large --;
Line 22, "X-ray" should read -- x-ray --; and "beam $L_1$," should read -- beam $L_1$ --;
Line 37, "X-rays" (both occurrences) should read -- x-rays --; and "wX" should read -- the wX --;
Line 40, "X-rays" (both occurrences) should read -- x-rays --; and "angle" should read -- angles --;
Line 41, "wZ" should read -- the wZ --;
Lines 44, 47, 51, 61, 62, 64 and 67, "X-ray" should read -- x-ray --;
Line 48, "X-rays" should read -- x-rays --; and "X-ray" should read -- x-ray --;
Line 49, "such" should read -- such a --; and "measured" should read -- measured, --;
Line 53, "these" should read -- this --; and
Line 58, "sensor" should read -- sensors --.

UNITED STATES PATENT AND TRADEMARK OFFICE
CERTIFICATE OF CORRECTION

PATENT NO. : 6,219,400 B1                                         Page 3 of 6
DATED : April 17, 2001
INVENTOR(S) : Takayuki Hasegawa et al.

It is certified that error appears in the above-identified patent and that said Letters Patent is hereby corrected as shown below:

Column 5,
Lines 1, 4, 17, 40 and 41, "X-ray" should read -- x-ray --;
Lines 5, 15, 30, 36, 44, 53 and 65, "X-rays" should read -- x-rays --;
Line 9, "X-rays" should read -- x-rays --; and "X-axis" should read -- the X-axis --;
Line 10, "tions" should read -- tions, --; and "wX," should read -- the wX, --;
Line 21, "stably as above" should read -- as above, --;
Line 22, "done" should read -- achieved --;
Line 23, "of X-ray" should read -- for the x-ray --;
Line 24, "apparatus" should read -- apparatus, --;
Line 29, "As regards," should read -- With regard to --; and "X-rays" should read -- x-rays --;
Line 39, "in" should read -- with --; and "simplification of" should read -- simplifying --;
Line 46, "thin" should read -- a small --;
Line 51, "concaved" should read -- concave --;
Line 52, "X-axis" should read -- the X-axis --;
Line 54, "intensity," should read -- intensity --;
Line 56, "beam $L_2$" should read -- beam $L_2$, --;
Line 60, "a unshown" should read -- an unillustrated --;
Line 63, "a" should read -- an --; and
Lines 64 and 66, "ambience" should read -- atmosphere --.

Column 6,
Lines 4, 15, 22, 29 and 63, "X-rays" should read -- x-rays --;
Lines 5 and 23, "X-rays," should read -- x-rays, --;
Lines 6, 10, 12, 17, 31, 34, 42, 44, 49 and 65, "X-ray" should read -- x-ray --;
Line 7, "largely. It causes large non-uniformness" should read -- to a large degree. It prevents uniformity --;
Line 8, "angle," should read -- angle --;
Line 24, "large" should read -- a large --;
Line 25, "X-ray" should read -- x-ray --; and "beam $L_2$," should read -- beam $L_2$ --;
Line 38, "mask $M_2$," should read -- mask $M_2$ --; and "X-ray" should read -- x-ray --;
Line 46, "as" should be deleted;
Line 47, "regards" should read -- with regard to --; and "X-ray" should read -- x-ray --;
Line 52, "As regards" should read -- Regarding --; and "X-ray" should read -- x-ray --;
Line 60, "result" should read -- results --; and "X-ray" should read -- x-ray --; and
Line 64, "X-ray" should read -- x-ray --; and "inverse" should read -- the inverse --.

UNITED STATES PATENT AND TRADEMARK OFFICE
CERTIFICATE OF CORRECTION

PATENT NO. : 6,219,400 B1
DATED : April 17, 2001
INVENTOR(S) : Takayuki Hasegawa et al.

It is certified that error appears in the above-identified patent and that said Letters Patent is hereby corrected as shown below:

Column 7,
Lines 2 and 10, "X-rays" should read -- x-rays --;
Lines 3, 5, 8, 14, 46, 53, 62 and 66, "X-ray" should read -- x-ray --;
Line 12, "which of X," should read -- in which of the X, --;
Line 13, "resides in." should read -- resides. --;
Line 15, "shown)" should read -- shown), --;
Line 31, "If for example" should read -- If, for example, --;
Line 57, "stably as above" should read -- as above, --;
Line 59, "done" should read -- accomplished --; and
Line 60, "of X-ray" should read -- for the x-ray --; and "apparatus" should read
-- apparatus, --.

Column 8,
Lines 7, 11, 17, 18, 23, 32, 48, 49 and 50, "X-ray" should read -- x-ray --;
Line 8, "X-rays" should read -- x-rays --;
Line 16, "invention," should read -- invention --;
Line 21, "X-ray mirror," should read -- x-ray mirror --;
Lines 31 and 39, "of" should read -- of the --;
Line 44, "1 l$b$," should read -- 11$b$ --;
Line 57, "a" should read -- an --; and "kept therein." should read -- maintained. --; and
Line 66, "X," should read -- the X, --.

Column 9,
Lines 2 and 11, "calculated" should read -- calculated, --;
Line 4, "into" should read -- with respect to --;
Lines 7, 8 and 34, "X-ray" should read -- x-ray --;
Line 18, "of" should read -- of the --;
Line 23, "as regards" should read -- regarding --;
Line 30, "of provision of" should read -- to provide --;
Line 33, "device" should read -- a device --;
Line 36, "procedure for" should read -- procedures for the --;
Line 42, "by" should be deleted;
Line 49, "process" should be deleted; and "sealing) process." should read -- sealing). --;
Line 50, "operation" should read -- an operation --; and "dura-" should read -- a dura- --;
Line 52, "step 5," should read -- step 5 --;
Line 53, "completed" should read -- completed, --; and
Line 61, "to" should read -- in --.

UNITED STATES PATENT AND TRADEMARK OFFICE
CERTIFICATE OF CORRECTION

PATENT NO. : 6,219,400 B1
DATED : April 17, 2001
INVENTOR(S) : Takayuki Hasegawa et al.

It is certified that error appears in the above-identified patent and that said Letters Patent is hereby corrected as shown below:

Column 10,
Line 9, "confined" should read -- limited --; and
Line 10, "forth" should read -- forth, --.

Column 10, line 14 - Column 12, line 6,
Claims 1-9 should be deleted and substituted with the following claims 1-9:

--1. An x-ray optical system comprising:

an x-ray illumination system having at least two mirrors, wherein at least one mirror is a collecting mirror having a concave surface;

a driving system for moving said at least two mirrors;

a detecting system having at least one sensor, for detecting at least one of tilt and incidence position of x-rays in said x-ray illumination system, wherein said at least one sensor is provided integrally with at least one of said at least two mirrors; and a control system for controlling movements of said at least two mirrors by said driving system on the basis of detection by said detecting system, wherein said at least two mirrors are moved by said driving system on the basis of an output of said sensor and wherein said at least two mirrors maintain a relative positional relationship with each other.

2. The x-ray optical system according to Claim 1, wherein said driving system is arranged to change the position and attitude of said at least two mirrors.

3. The x-ray optical system according to Claim 1, wherein said detecting system comprises first sensors provided with respect to said at least two mirrors, respectively, for detecting tilt of an optical axis of an x-ray beam, and second sensors provided with respect to said at least two mirrors, respectively, for detecting one of incidence position of the x-ray beam and an angle thereof about the optical axis.

4. The x-ray optical system according to Claim 1, wherein said detecting system comprises a first sensor provided in relation to one of said at least two mirrors, for detecting tilt of an optical axis of an x-ray beam, and a second sensor provided in relation to the one mirror, for detecting one of incidence position of the x-ray beam and an angle thereof about the optical axis, and wherein said control system controls movement of the one mirror by said driving means on the basis of detection by said detecting system and also controls movement of the other or another mirror of said at least two mirrors on the basis of the detection by said detecting means and a drive amount for the one mirror.

5. The x-ray optical system according to Claim 1, wherein said x-ray illumination system is arranged to collect the x-rays in one direction with respect to a sectional plane of the x-ray beam and to expand the x-rays in another direction with respect to the sectional plane.

6. The x-ray optical system according to claim 1, wherein said x-ray illumination system is arranged to perform scanning illumination with x-rays.

UNITED STATES PATENT AND TRADEMARK OFFICE
CERTIFICATE OF CORRECTION

PATENT NO. : 6,219,400 B1
DATED : April 17, 2001
INVENTOR(S) : Takayuki Hasegawa et al.

It is certified that error appears in the above-identified patent and that said Letters Patent is hereby corrected as shown below:

<u>Column 10, line 14 - Column 12, line 6 (cont'd),</u>

7. An x-ray exposure apparatus for exposing an object to x-rays comprising:

an x-ray illumination system having at least two mirrors, wherein the object can be exposed with x-rays projected through action of said at least two mirrors, wherein at least one mirror is a collecting mirror with a concave surface;

a driving system for moving said at least two mirrors;

a detecting system having at least one sensor, for detecting at least one of tilt and incidence position of x-rays in said x-ray illumination system, wherein said at least one sensor is provided integrally with at least one of said at least two mirrors; and a control system for controlling movements of said at least two mirrors by said driving system on the basis of detection by said detecting system, wherein said at least two mirrors are moved by said driving system on the basis of an output of said sensor and wherein said at least two mirrors maintain a relative positional relationship with each other.

8. The apparatus according to Claim 7, wherein said x-ray illumination system is arranged to collect the x-rays in one direction with respect to a sectional place of the x-ray beam and to expand the x-rays in another direction with respect to the sectional plane.

9. The apparatus according to Claim 7, wherein said x-ray illumination system is arranged to perform exposure of the object with x-rays.--

Signed and Sealed this

Twenty-sixth Day of July, 2005

JON W. DUDAS
*Director of the United States Patent and Trademark Office*